United States Patent
Yamamoto

(10) Patent No.: US 6,881,618 B2
(45) Date of Patent: Apr. 19, 2005

(54) METHOD OF MANUFACTURING A DUAL GATE SEMICONDUCTOR DEVICE WITH A POLY-METAL ELECTRODE

(75) Inventor: Naoki Yamamoto, Kawaguchi (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/787,436

(22) Filed: Feb. 27, 2004

(65) Prior Publication Data

US 2004/0180490 A1 Sep. 16, 2004

Related U.S. Application Data

(62) Division of application No. 10/448,351, filed on May 30, 2003, now Pat. No. 6,727,132, which is a division of application No. 10/272,369, filed on Oct. 17, 2002, now Pat. No. 6,645,799, which is a division of application No. 09/639,306, filed on Aug. 16, 2000, now Pat. No. 6,503,788.

(30) Foreign Application Priority Data

Jan. 24, 2000 (JP) .......................................... 2000-17875

(51) Int. Cl.$^7$ .......................................... H01L 21/8238
(52) U.S. Cl. ...................... 438/199; 438/216; 438/223; 438/229; 438/231
(58) Field of Search ................................ 438/199, 216, 438/223, 224, 227, 228, 229, 230, 231, 232, 252

(56) References Cited

U.S. PATENT DOCUMENTS

| | | | |
|---|---|---|---|
| 5,278,085 A | * | 1/1994 | Maddox et al. .............. 438/224 |
| 5,683,920 A | | 11/1997 | Lee |
| 5,780,330 A | | 7/1998 | Choi |
| 6,051,459 A | * | 4/2000 | Gardner et al. .............. 438/231 |
| 6,300,184 B1 | | 10/2001 | Choi et al. |
| 6,503,788 B1 | | 1/2003 | Yamamoto |
| 2002/0110969 A1 | | 8/2002 | Mori et al. |

OTHER PUBLICATIONS

IEEE Electron Device Let., vol. 17, No. 11, Nov. 1996, pp. 497–499.

* cited by examiner

*Primary Examiner*—Jack Chen
(74) *Attorney, Agent, or Firm*—Antonelli, Terry, Stout & Kraus, LLP

(57) ABSTRACT

In order to realize a dual gate CMOS semiconductor device with little leakage of boron that makes it possible to divisionally doping a p-type impurity and an n-type impurity into a polycrystalline silicon layer with one mask, a gate electrode has a high melting point metal/metallic nitride barrier/polycrystalline silicon structure. The boron is pre-doped in the polycrystalline silicon layer. The phosphorus or arsenic is doped in an n-channel area. Then, the annealing in a hydrogen atmosphere with vapor added therein is performed. As a result, the boron is segregated on the interface of the metallic nitride film and the phosphorus is segregated on the interface of the gate oxide film, for forming an n+ gate.

15 Claims, 7 Drawing Sheets

ANNEALING IN N2, 900°C, 10min

ANNEALING IN H2, 900°C, 10min

ANNEALING IN H2 WITH 5%H2O, 900°C, 10min

W/WN/POLY-Si GATE (THIS WORK) { ● p-CHANNEL MOSFET / ○ n-CHANNEL MOSFET

W/WN/POLY-Si GATE (PREVIOUS) { ▲ p-CHANNEL MOSFET / △ n-CHANNEL MOSFET

POLY-Si GATE (CONVENTIONAL) □ n-CHANNEL MOSFET

RELATIONSHIP BETWEEN DEPLETION WIDTH AND APPLIED VOLTAGE/CONCENTRATION OF SUBSTRATE

RELATIONSHIP BETWEEN BREAKDOWN VOLTAGE OF pn JUNCTION AND CONCENTRATION OF SUBSTRATE

METHOD OF MANUFACTURING A DUAL GATE SEMICONDUCTOR DEVICE WITH A POLY-METAL ELECTRODE

CROSS-REFERENCE TO RELATED APPLICATIONS

This application is a divisonal of application Ser. No. 10/448,351 filed on May 30, 2003, now U.S. Pat. No. 6,727,132 which is a divisional application Ser. No. 10/272,369 filed on Oct. 17, 2002, now U.S. Pat. No. 6,645,799, which is a divisional of application Ser. No. 09/639,306 filed on Aug. 16, 2000, now U.S. Pat. No. 6,503,788. The contents of application Ser. Nos. 10/448,351, 10/272,369 and 09/639,306 are hereby incorporated herein by reference in their entirety.

BACKGROUND OF THE INVENTION

The present invention relates to a CMOS (Complementary Metal-oxide Semiconductor) type semiconductor device having a gate electrode of p type and n type conductive polycrystalline silicon and a method of manufacture thereof.

The current trend of the semiconductor device has been changed from a CMOS semiconductor device whose gate electrode is composed of only polycrystalline silicon containing an n-type impurity into the so-called dual gate CMOS semiconductor device in which the gate electrode of an n-channel MOS transistor is composed of polycrystalline silicon containing an n-type impurity and the gate electrode of a p-channel MOS transistor is composed of polycrystalline silicon containing a p-type impurity. This dual gate contains a silicon oxide film, a silicon nitride film or resist coated on the surface of the polycrystalline silicon except a target area. A target area (for example, n-type) impurity is implanted in the non-coated area with these films as a mask by means of the ion-implantation technique or the diffusion technique. After removing this mask materials, the surface of the polycrystalline silicon on the area having the above-mentioned impurity is covered with the similar mask materials. The impurity having the opposite conductive type (for example, p type) to the above-mentioned impurity is implanted in the non-covered area by means of the ion-implantation technique.

For dividing the polycrystalline area into an n+ and a p+ conductive areas, as mentioned above, a mask material is formed on a specific area in doping a target impurity, which needs two associative processes of forming a mask. It is thus necessary to perform each process of forming a mask film, doing photolithography, and dry-etching a mask film twice. It means that the dual gate CMOS semiconductor composed as above has more manufacturing steps than the CMOS semiconductor device composed of polycrystalline silicon containing only one conductive impurity. This brings about the lowering of a manufacturing yield and the rise of a manufacturing cost of the semiconductor device and therefore the rise of a product cost. Further, the slip of fitting the mask patterns may be brought about in dividing the n-type and the p-type areas in the photolithography process. Hence, the fitting allowance is required, which has been an obstacle to finning the element and enhancing the concentration of the semiconductor device.

On the other hand, the MOS transistor having as a component of a gate electrode polycrystalline silicon or amorphous silicon film containing boron has a shortcoming that by performing a high temperature annealing with respect to the MOS transistor after forming the gate electrode, the boron is diffused from the gate electrode into a gate oxide film, in a worse case, penetrates the gate oxide film and reaches the silicon substrate, thereby causing a threshold voltage of the transistor to shift from a design value. It has been reported that the annealing in a hydrogen atmosphere diffuses boron through the gate oxide film faster than the annealing in a nitrogen atmosphere. (IEEE Electron Device Let., Vol.17, No.11, pp497 to 499) In order to enhance the integration of the semiconductor device, the need for development of an SAC (Self-aligned contact) technique has risen. This SAC technique is composed by covering the gate electrode with a silicon nitride film and a silicon oxide serving as an insulating film between a gate electrode and the upper metal layer for an interconnection on the silicon nitride. Then, a contact hole, which is served as connecting the source and the drain of the MOS type semiconductor device with the electrode wiring, is formed by the dry-etching technique. In this dry-etching technique, the process is conditioned in order to make the etching speed of the silicon oxide faster than that of the silicon nitride. As a result, if the deviation of the designed position of a contact hole to a gate electrode pattern is brought about in the photolithography process, no short takes place between the gate electrode and the source or the drain.

The silicon nitride film that is important to this SAC technique is generally formed by means of the CVD (Chemical Vapor Deposition). This silicon nitride film contains several percents to 20 percents of hydrogen. This hydrogen serves to accelerate leakage of boron contained in the polycrystalline silicon layer into the substrate. In an extreme case, the amount of boron to be leaked through the gate oxide film is made so large that the channel area n-type silicon substrate of the p-channel MOS transistor is inverted into the p-type one.

SUMMARY OF THE INVENTION

It is an object of the present invention to provide a dual gate CMOS type semiconductor device which is composed to simplify the process of doping an impurity into a polycrystalline silicon layer formed in the aforementioned dual gate CMOS, reduce the leakage of boron in the hydrogen-related process as much as possible, and thereby have a target threshold voltage.

In the MOS transistor having as a gate electrode an amorphous or polycrystalline silicon film containing boron, by performing a high temperature annealing in a hydrogen atmosphere for the transistor fabrication (for example, at a temperature of 950° C. and for ten minutes), the threshold voltage Vth obtained in the case of performing an annealing in a nitrogen atmosphere at the same temperature and during the same interval is shifted from about 1.5 V to 2.0 V. This indicates that the accelerating effect of hydrogen on boron diffusion in a silicon oxide film may bring about leakage of boron from the gate electrode into the substrate.

It has been found by means of the secondary ion mass spectroscope (SIMS) that if the annealing in a nitrogen atmosphere is performed with respect to the surface of the polycrystalline silicon containing boron, coated with a metal nitride film such as tungsten nitride (WNx) and titanium nitride (TiNx), the boron doped in the polycrystalline silicon is segregated into the interface of the metal nitride film as shown in FIG. 2A. Even in the same structure, however, the annealing in a hydrogen atmosphere brings about diffusion of boron onto the substrate, thereby causing lots of boron to be leaked into the substrate through the gate oxide film.

If the annealing is performed in an atmosphere where several percents of vapor is added to hydrogen, as shown in FIG. 2C, it has been found that the boron contained in the silicon is segregated into the metal nitride interface like the annealing in a nitrogen atmosphere.

On the other hand, it has been found that phosphorus or arsenic used as an n-type impurity doped in polycrystalline silicon is segregated into the gate insulating film interface composed of silicon oxide on the lower layer and has a high concentration on the interface.

This phenomenon, in which the boron served as a p-type impurity contained in the polycrystalline silicon in the metal nitride film/polycrystalline silicon/gate insulating film structure has a different segregated interface from phosphorus or arsenic served as an n-type impurity contained therein, makes contribution to both simplifying the dual gate CMOS process and reducing leakage of boron at a time.

That is, at first, boron is contained on the overall surface of the polycrystalline silicon film and a material served as a mask for screening phosphorus or arsenic is coated on the surface outside of the target area. In this state, an n-type impurity such as phosphorus or arsenic is implanted onto the non-mask area by means of the ion-implantation technique or the diffusion technique. Then, the mask material is removed and then another layer such as a metallic nitride layer is formed in place. Next, the annealing is performed in a nitrogen atmosphere or a hydrogen atmosphere with vapor added thereto. As a result, boron is segregated on the metallic nitride interface in the area where boron and an n-type impurity are dually doped (for example, in the case of implanting $2\times10^{15}/cm^2$ of boron or arsenic) and the concentration is made lower to $(1\times10^{20}/cm^2)$ on the insulating film interface on the ground. On the other hand, arsenic is segregated onto the gate insulating film interface and thus is high in concentration $(2\times10^{20}/cm^2)$. As a result, as shown in FIG. 1, the area in which phosphorus is contained is made to be an n-type one, while the other area includes a polycrystalline silicon gate electrode having a p-type conductive characteristic. That is, only one process for specifying a doping area makes it possible to form a dual gate and allow the boron in the polycrystalline silicon to be segregated onto the metallic nitride interface, thereby reducing the leakage of boron.

DESCRIPTION OF THE EMBODIMENTS

First Embodiment

Figure 1:
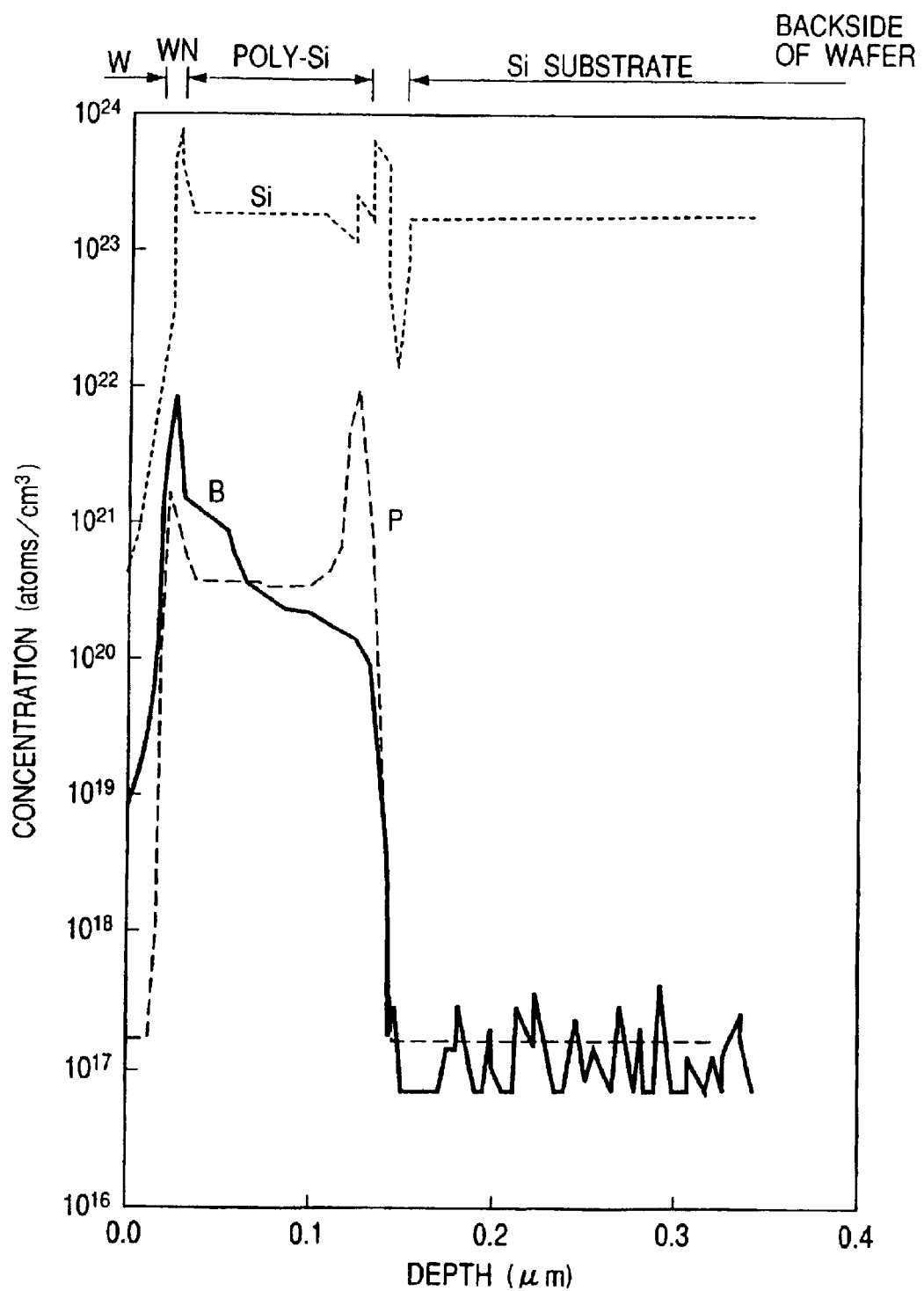
FIG. 1 is a graph showing a measured result by a secondary ion mass spectrograph with respect to the p-type impurity and the n-type impurity in the NMOS of the semiconductor device according to the first embodiment of the invention.
Figure 2A:
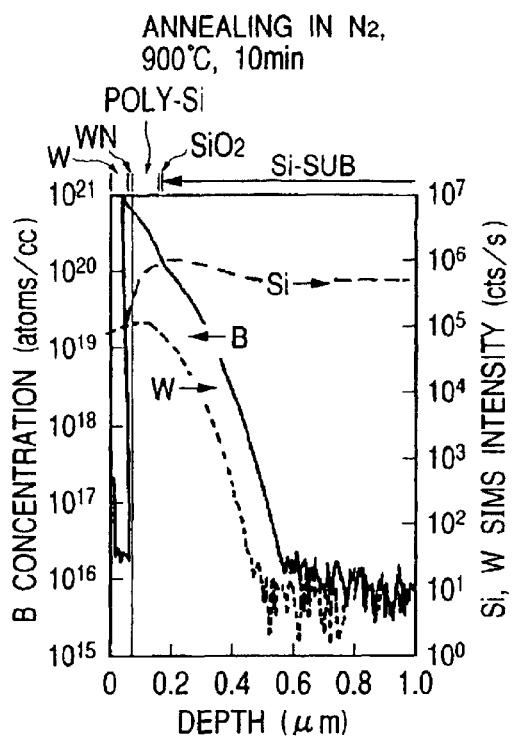
FIGS. 2A to 2C are graphs showing boron distributions after annealing in the NMOS of the semiconductor according to the invention.
Figure 2B:
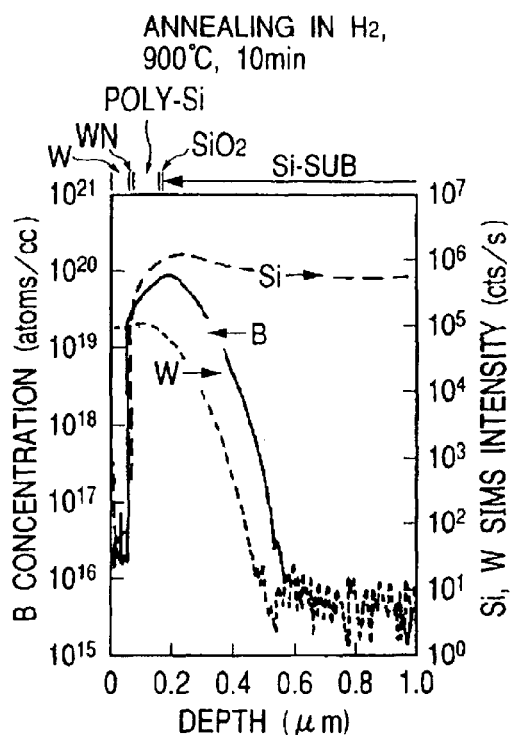
Figure 2C:
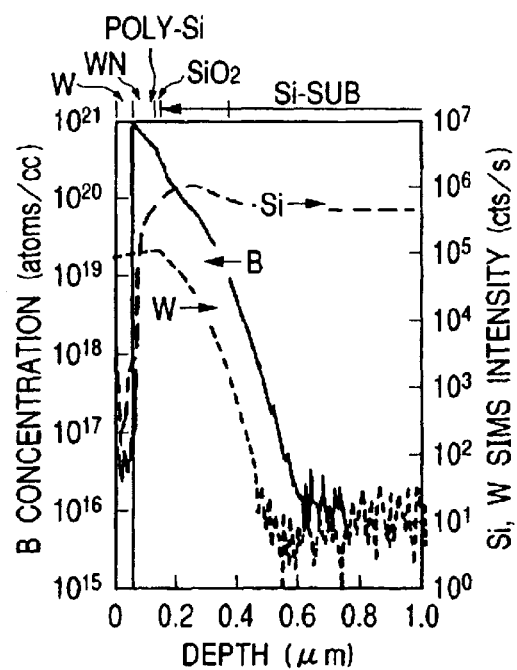
Figure 3A:
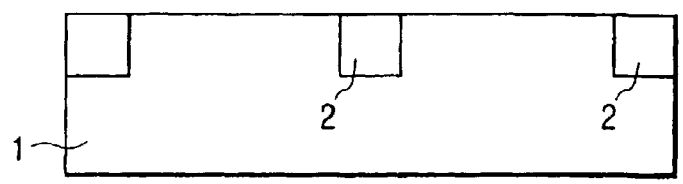
FIGS. 3A to 3E are sectional views of a semiconductor device at each step of a manufacturing method according to the first embodiment of the invention.
Figure 3B:
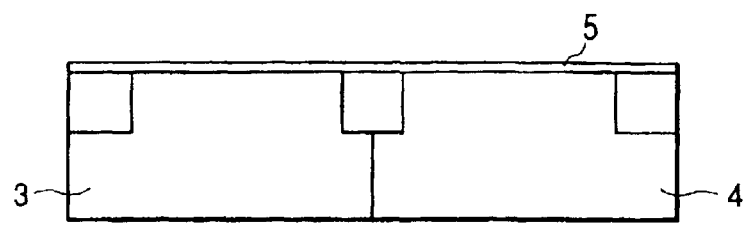
Figure 3C:
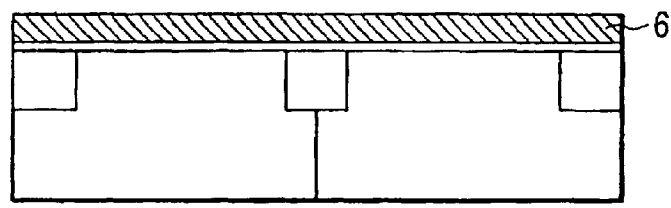
Figure 3D:
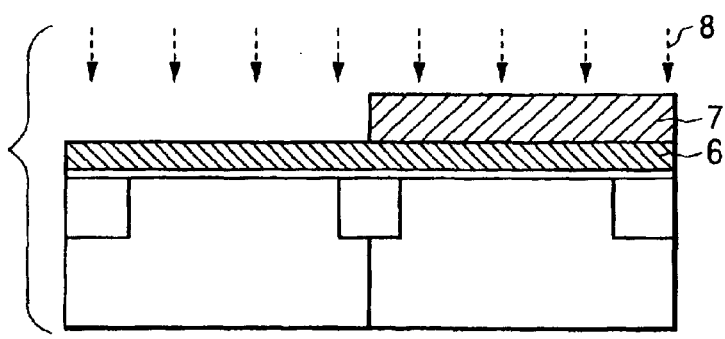
Figure 3E:
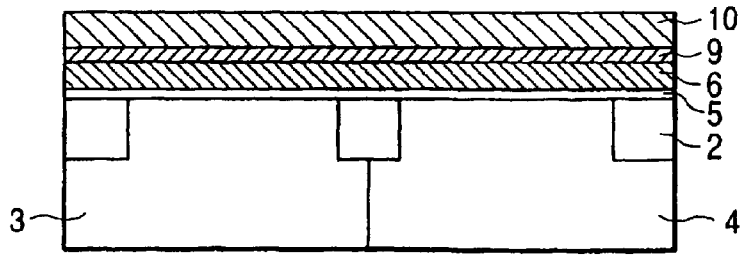

The description will be oriented to a process of making a dual gate CMOS transistor according to this embodiment with reference to FIGS. 3A to 3E and 4A to 4E. Herein, the description will be oriented to a stacked gate electrode composed of a metal (tungsten) stacked on the metallic nitride formed on the polycrystalline silicon. This structure also serves to lower the resistance of the gate electrode. In these figures, the left-half portion indicates the NMOS formed area, while the right-half portion indicates the PMOS formed area.

In the following description, the well-related process for forming a trench type insulating area for separating elements provided on a silicon substrate and a p-channel and an n-channel MOS transistor areas on the same silicon substrate and the process for doping an impurity onto the channel areas for keeping the threshold voltage of each MOS transistor at a target value will be roughly described below, because those processes are not essential components to the present invention. Moreover, though the actual highly integrated semiconductor device employs multi-interconnection, the present embodiment does not use it for the convenience's sake.

A p-type 10 Ω·cm silicon substrate 1 is prepared. A trench of 400 nm is formed in the interface between elements to be formed on the substrate by means of the photolithography technique and the dry-etching technique. Then, after the 10 nm oxidation on the silicon surface, a silicon oxide film having a depth of 500 nm is formed by means of the CVD technique. Then, by performing an annealing of 1000° C. in an oxygen atmosphere, the silicon oxide film is densitied. Next, silicon oxide is removed from a flat portion of the silicon substrate by means of the CMP (Chemical Mechanical Polishing) technique and then silicon oxide 2 is buried only in the trench (see FIG. 3A).

Next, for forming a p-type well area 3 and an n-type well area 4 at a predetermined areas where a p-channel and an n-channel MOS transistors are to be formed, boron is ion-implanted into the left-half portion and phosphorus is ion-implanted into the right-half portion. Then, the annealing of 1000° C. in a nitrogen atmosphere is carried out for 20 minutes. Afterwards, by oxidizing the surface of the substrate at 850° C., an $SiO_2$ film having a thickness of 2.8 nm is formed. Then, the surface is heat-treated at an oxide nitrogen atmosphere for forming a silicon oxide nitride film (silicon oxynitride) 5. These annealings complete a gate insulating film 5 of 3 nm (see FIG. 3B). The impurity concentration on the surface of the substrate that is approximate to adjusting the threshold voltage of each MOS transistor may be achieved by ion-implanting phosphorus or boron in the range of $1\times10^{12}/cm^2$ to $3\times10^{13}/cm^2$. In addition, though various implantations are fried, even for the dual gate CMOS based on the conventional method, the manufacturing conditions of the MOS transistor having the most approximate threshold voltage are not defined.

Next, amorphous silicon 6 is deposited to a thickness of 70 nm. In forming the amorphous silicon, borohydride gas is introduced for doping boron into the amorphous film. A certain material was produced by using the ion-implanting method for doping boron onto the amorphous silicon film. In this case, the amorphous silicon film to which no impurity is doped is pre-formed and then boron ions are implanted at a voltage of 5 keV in the range of $1 \times 10^{15}$ units/cm$^2$ to $5 \times 10^{15}$ units/cm$^2$. In actual, various materials were produced with various implantations.

Then, a silicon oxide film is deposited at a depth of 200 nm by means of the CVD method. Then, a silicon oxide film 7 is left only at target positions (where the PMOS is formed) on the wafer by means of the photolithography and the dry-etching technique. Afterwards, with this silicon oxide film 7 as a mask, phosphorus 8 is ion-implanted into the amorphous silicon film of a non-masked area (where the NMOS is formed). Various amounts of phosphorus were implanted at 15 keV in the range of $1 \times 10^{15}$ units/cm$^2$ to $5 \times 10^{15}$ units/cm$^2$ (see FIG. 3D).

Next, contaminant adherent to the surface of the material during the ion-implantation is removed by the method such as ashing and then an oxide film on the amorphous silicon is removed by means of hydrofluolic acid. Then, a tungsten nitride (WNx) 9 is formed to have a thickness of 5 nm at a low pressure atmosphere (0.3 Pa) of a mixture of an argon gas and a nitrogen gas by means of the sputtering equipment. In succession, within the same chamber, by stopping the nitrogen gas flow, at an atmosphere of only Ar gas, the tungsten (W) 10 is deposited at a depth of 50 nm by means of the sputtering technique (see FIG. 3E). Then, a silicon nitride film having a depth of 150 nm is formed by means of the plasma CVD method.

Figure 4A:
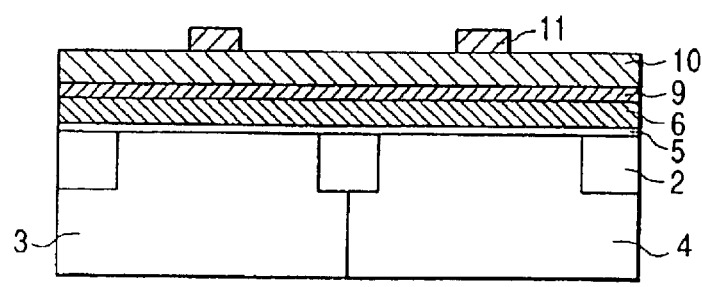
FIGS. 4A to 4E are sectional views of a semiconductor device at each step of a manufacturing method according to the first embodiment of the invention.
Figure 4B:
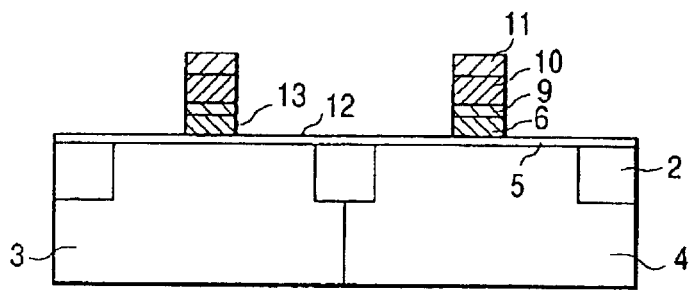
Figure 4C:
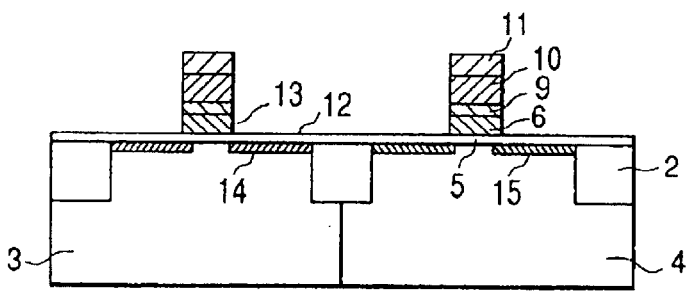
Figure 4D:
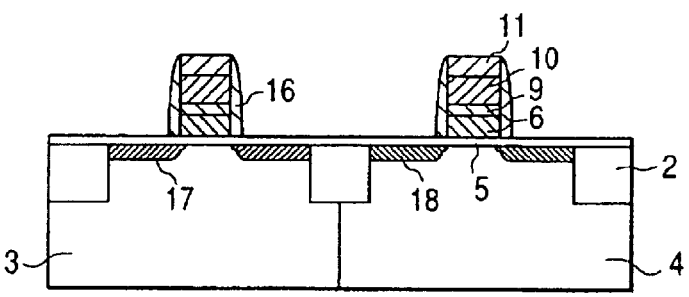
Figure 4E:
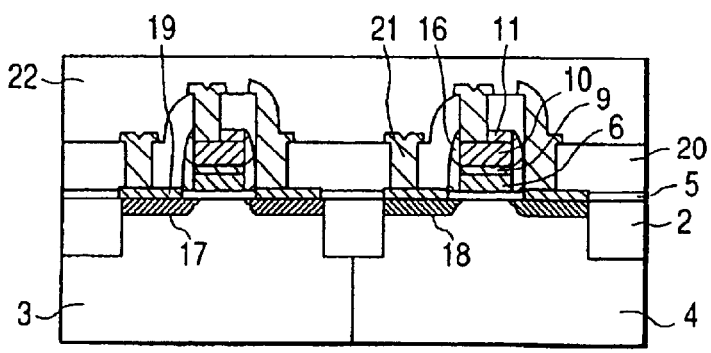

Then, by using the normal photolithography technique and dry-etching technique, the silicon nitride film 11 located on the top layer is worked to a target gate electrode form (see FIG. 4A). Then, with the silicon nitride film 11 as the mask, the tungsten, the tungsten nitride and the amorphous silicon layer are worked at a batch (see FIG. 4B). Afterwards, the photoresist located at the top is removed by the conventional plasma ashing process. Then, the surface oxide of the silicon substrate around the gate electrode that is contaminated and damaged by those dry etching is wet-etched by means of a mixture of hydrofluoric acid and vapor.

Next, vapor is added to the hydrogen atmosphere at a pressure ratio of 10% and then the annealing is performed at 750° C. and for 30 minutes. This heat treatment results in oxidizing the silicon substrate surface 12 around the gate electrode and the side wall 13 of the gate electrode silicon layer under W/WNx that has been changed from an amorphous material into a polycrystalline material. In addition, the annealing at the atmosphere of vapor-added hydrogen results in selectively oxidizing the exposed silicon surface without oxidizing the tungsten 10 and the tungsten nitride 9. This process for selectively oxidizing the silicon is intended to recovering reliability of the gate oxide film that was subject to damage in the dry-etching process. After the process of re-oxidizing the silicon substrate, a resist pattern for covering the PMOS area is formed by means of the normal photolithography technique. With the resist pattern and the silicon nitride film 11 on the NMOS area as mask materials, by using the ion-implanting device, phosphorus ions of $2 \times 10^{13}$/cm$^2$ are implanted onto the silicon substrate at 10 keV for forming an n-type semiconductor area 14. Then, the resist pattern for covering the NMOS area is formed by means of the normal photolithography technique. With this resist pattern and the silicon nitride film 11 of the pMOS area as the masks, BF2 ions of $2 \times 1^{14}$/cm$^2$ are implanted at 10 keV by means of the ion-implanting method, for forming a p-type semiconductor area 15 (see FIG. 4C).

After the process for implanting ions, the silicon nitride film is deposited to a thickness of 70 nm by means of the low pressure CVD device. Afterwards, the silicon nitride film on the flat portion is removed by the anisotropic ion etching device, so that the silicon nitride film 16 is left only on the side wall of the gate electrode. Then, in the same procedure of implanting ions, the n-type and p-type impurities are implanted onto the silicon substrate. In this case, arsenic ions of $2 \times 10^{15}$/cm$^2$ are implanted as an n-type impurity at 40 keV, and then BF2 ions of $2 \times 10^{15}$/cm$^2$ are implanted as p-type impurity at 15 keV, for forming an n+ type semiconductor area 17 and a p+ type semiconductor area 18 (see FIG. 4D).

After these series of processes for doping an impurity, the annealing is performed for 30 seconds and at a temperature of 950° C. and in a hydrogen atmosphere with 5% of vapor added thereto. This annealing is intended for electrically activating the implanted impurity on the silicon substrate. If this annealing is performed in a nitrogen atmosphere, the hydrogen contained in a silicon nitride film formed on the side wall of the gate electrode causes boron to be likely leaked from the gate electrode into the substrate. After forming the source and the drain of the MOS transistor, the thin silicon oxide film formed on the surface of the silicon substrate is removed by the hydrofluoric acid system etchant. In succession, Co is deposited to a thickness of 8 nm by means of the sputtering device. On the layer of Co is deposited TiNx having a depth of 20 nm. In this state, the annealing is performed at a temperature of 550° C. and in a nitrogen atmosphere. Then, with a mixture of sulfuric acid and hydrogen peroxide, the layer of TiN and the layer of Co that is not reactive with the silicon of the substrate are removed by the wet etching method. This annealing causes a CO silicide 19 to be left only on the pre-ion-implanted surface of the silicon substrate for the purpose of self-adjustment. Further, the annealing at a temperature of 850° C. and in a nitrogen atmosphere causes the Co silicide to be low in resistance.

Next, an SiO$_2$ film served as an interlaminar insulating film 20 is deposited at a depth of 500 nm by means of the plasma CVD method. Then, on the surface of the SiO$_2$ film is coated fused silica glass. Then, the annealing is performed at a temperature of 950° C. and for one minute. Afterwards, a contact hole is formed for electrically conducting a given spot by means of the photolithography and the dry etching technique. In the process for forming the contact hole, the connecting hole to the source and the drain is partially overlapped with the gate electrode in the fine MOS transistor because of the shift of the mask fitting of the photolithography. However, since a relatively thick silicon nitride film is formed on the gate electrode, in the process for forming a hole in the silicon oxide insulating layer, the silicon nitride film is left. Hence, it is possible to avoid the short between the gate electrode and the aluminum electrode formed on the contact hole to the source or the drain. Then, another contact hole for connecting an electrode for inputting or outputting a signal to or from the gate electrode is formed by another dry etching process rather than the foregoing etching process. Afterwards, by means of the sputtering device, tungsten is deposited to a thickness of 50 nm and then a tungsten film having a thickness of 500 nm is formed by means of the CVD method. The tungsten layer formed by this sputtering method is used as a cohesion layer, because the tungsten film formed by the CVD method has poor coherence with the silicon insulating film on the ground. Next, like each layer, this tungsten layer is applied to the interconnection pattern 21 by means of the normal photolithography and the normal dray etching techniques.

On this interconnection layer is deposited a silicon oxide film of 200 nm by means of the plasma CVD method. This silicon oxide film is served as a layer 22 for preventing an intruder that leads to lowering reliability of the semiconductor device such as an contaminant. Further, an electrode connecting hole from the outside of the chip is formed at a given area. Lastly, for removing the damages caused by the foregoing various dry etching processes, the annealing in a hydrogen atmosphere is performed at a temperature of 450° C. and for 30 minutes. This completes the semiconductor device according to the invention (see FIG. 4E).

The estimation is performed with respect to the MOS transistor characteristic of the stacked dual gate CMOS semiconductor device composed of W/WNx/polycrystalline silicon formed by the foregoing processes. In order to make sure of the effect of the invention, the two prior arts, that is, the polycrystalline silicon dual gate CMOS semiconductor device formed by the doping separating method with two masks and the stacked dual gate CMOS semiconductor device of W/WNx/polycrystalline silicon doped by the same method, were prepared. The formation of the dual gate by the conventional method needs a process of forming a mask for selecting an ion-implanting area for doping an impurity to a amorphous silicon layer twice. These processes are a mask forming process for doping an n-type or p-type impurity into a specific area after forming the amorphous silicon and another mask forming process for doping an opposite type impurity on the remaining amorphous silicon area as covering the pre-doped area with a mask material. The formation of the mask materials on the specific area needs the photolithography and the dry etching processes and the accessory process for removing the mask materials.

The estimation is performed with respect to the transistor characteristic of the present embodiment and the dual gate CMOS semiconductor device created for the comparison.

Figure 5:
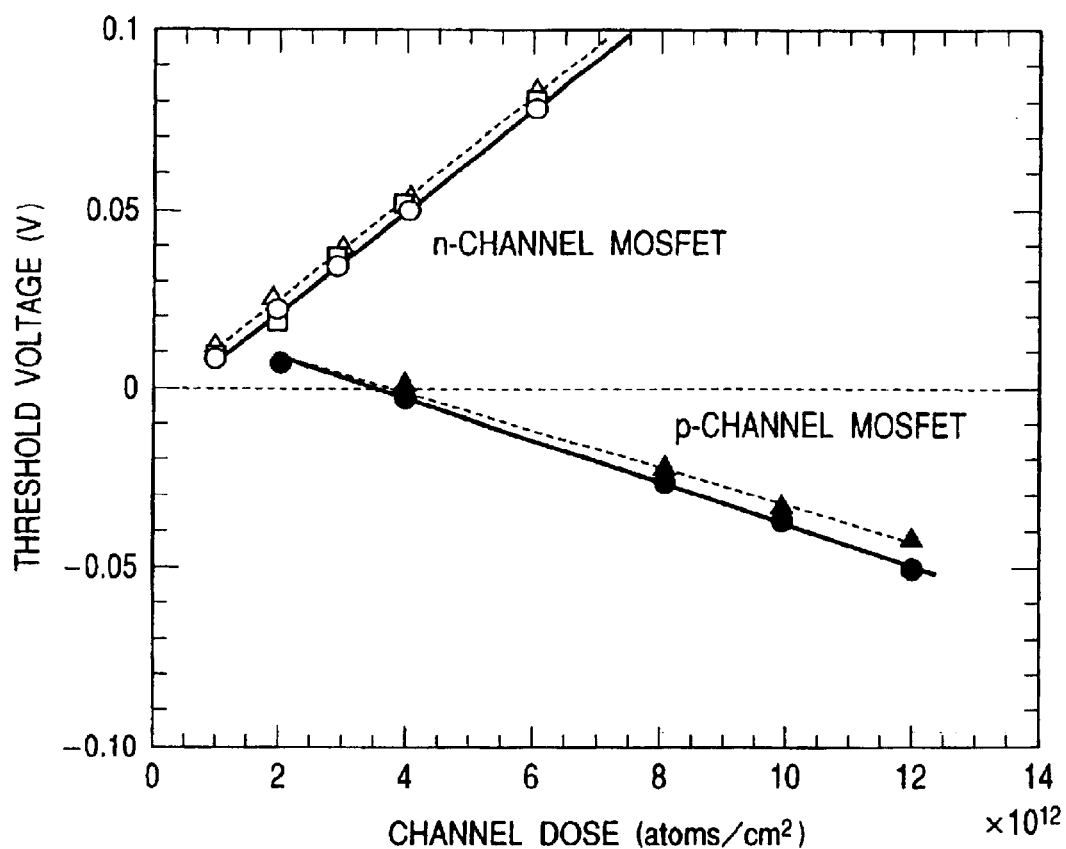
FIG. 5 is a graph showing a comparison between the transistor of the invention and the conventional transistor.

As a representative example, the dependency on the impurity concentration was obtained. The impurity introduced into the channel area is intended for adjusting the threshold voltage of the n-channel and the p-channel MOS transistors whose gate electrode working dimension is 0.25 $\mu$m. As shown in FIG. 5, the threshold voltage of the MOS transistor formed by this embodiment indicates the almost same dependency on the impurity concentration of the channel area as the characteristic of the stacked dual gate CMOS semiconductor device formed by the conventional method. In particular, these threshold voltages are in proportion to the concentration of the impurity contained in the channel area. Hence, the leakage of boron to the substrate is negligible in the operation of the circuit. On the other hand, for the polycrystalline silicon gate CMOS with no stack of W/WNx, the threshold voltage on the substrate surface of the p-channel MOS transistor is shifted from an estimated value by 0.5 V to 1.0 V. In an extreme case, boron is so much leaked that the n-type substrate surface may be changed into the p-type one. Hence, no normal MOS transistor characteristic could be obtained. The n-channel MOS transistor indicates the estimated dependency on the concentration of the channel area in the substrate even if it uses any type of gate electrode. It is understood from these results that the dual gate CMOS formed by the present invention allows the n-channel and the p-channel MOS transistors to operate normally. The other transistor basic characteristics such as channel conductance and driving current do not indicate any defect in an element characteristic caused by dually doping the n-type and p-type impurities onto the amorphous silicon layer.

Figure 6A:
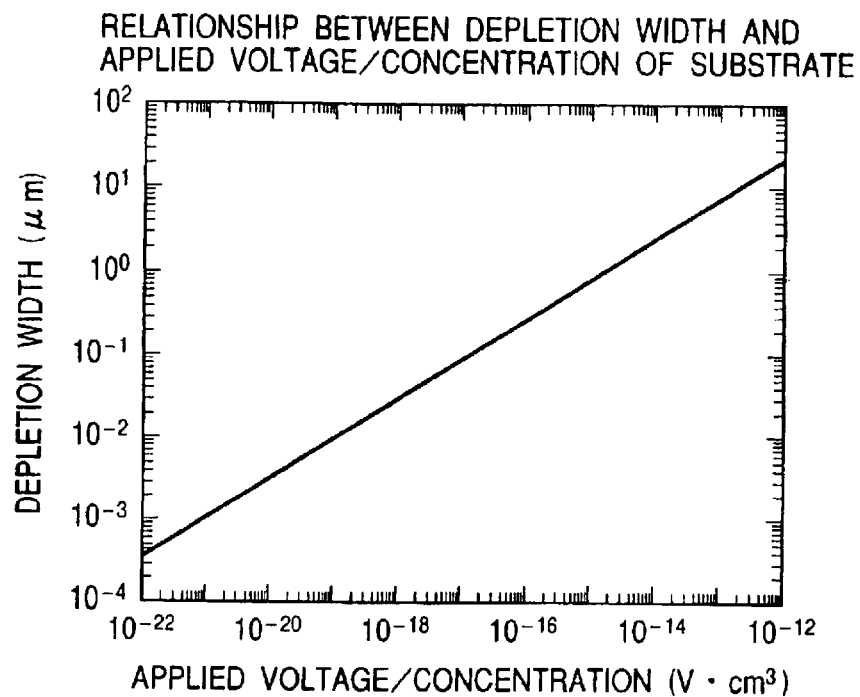
FIGS. 6A to 6B are graphs showing dependency of an impurity concentration on a depletion width formed in an n+/p+ junction in the NMOS of the semiconductor device according to the invention and dependency of an impurity concentration on a breakdown voltage of the junction therein.
Figure 6B:
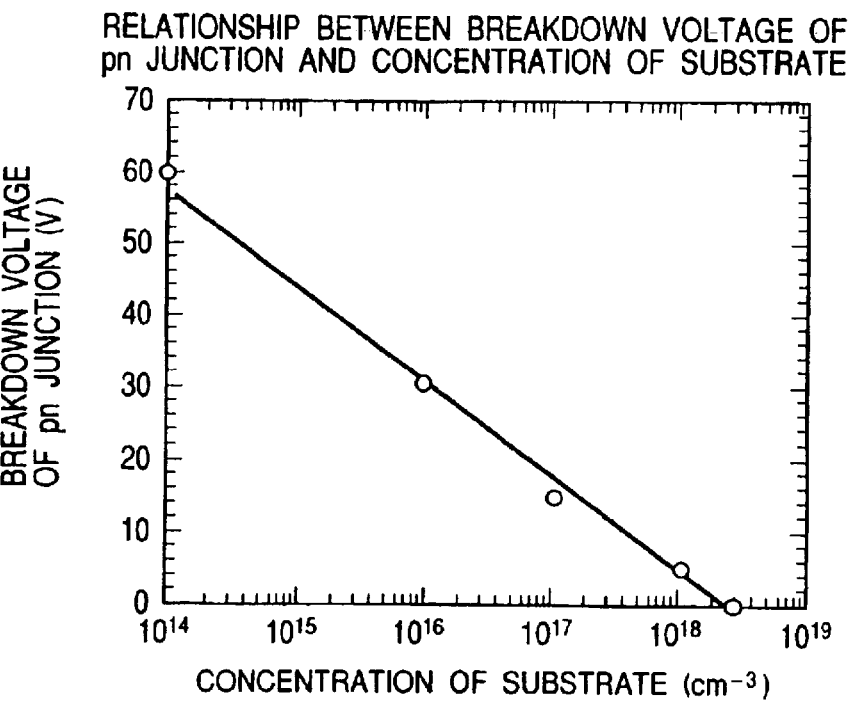

It is understood from the present embodiment that the dual gate CMOS does not show any defective transistor characteristic. As shown in FIG. 1, however, the n-type and the p-type junctions are formed in the thickness direction of the polycrystalline silicon layer of the stacked gate electrode as shown in FIG. 1. The depletion layer is formed on the interface between the junctions, so that it may disadvantageously serve to be non-conductive. Then, the relationship between the depletion width and the applied voltage/concentration of the substrate and the relationship between the breakdown voltage of the pn junction and the concentration of the substrate were obtained by calculation. As shown in FIGS. 6A and 6B, if the concentration of the impurity is about $5 \times 10^{18}/cm^3$ or more, the depletion width is 1 nm or lower and the breakdown voltage of the junction is 0.1 V or lower as well. As shown in FIG. 1, since the concentration gradient of boron is acute, the junction indicates the stepwise distribution of the impurity. On this interface, both of the n-type and the p-type impurities reach as high a concentration as $1 \times 10^{20}/cm^3$ or more. It means that no defective conduction caused by the formation of the depletion layer is brought about. In order to check the studied result, a ring oscillator arranged to use the dual gate CMOS were produced, in which a signal delay time for one step of the inverter was estimated. As a result, the signal delay time of the device formed according to the invention indicates the same value as the prior art in which the impurities are separately doped into the polycrystalline silicon. Concretely, for the MOS transistor whose gate electrode working dimension is 0.14 $\mu$m, the signal delay time per one step was 20 picoseconds.

Further, the estimation is performed with respect to the foreign particle appearing in the doping-related process in the present invention and the semiconductor device in which the conventional impurity doping method is applied to the polycrystalline silicon layer. For the conventional method, 100 to 200 foreign particles, each of which is 0.3 $\mu$m or more, were detected per an 8-inch wafer, while for the present invention, 10 to 80 foreign particles were detected. This is because the number of steps for doping the impurities is reduced from 16 to 8. In particular, if boron is doped in the formation of the silicon film by introducing a boron hydrogen compound gas in the CVD process for forming the amorphous silicon, the foreign particles were reduced more than those caused by doping boron with the ion-implantation method after forming the film, concretely, the number of those foreign particles were reduced to 10 to 40.

The reduction of the foreign particles and the manufacturing steps in this embodiment serves to improve the manufacturing yield of the semiconductor device more than the conventional method by about 5%. The reduction of the manufacturing steps and the improvement of the yield may lead to reduction of the manufacturing cost by several percents though it does not apply to any type of semiconductor device. It is assured that the boron segregation onto the WNx interface by the annealing in the hydrogen atmosphere with vapor added thereto leads to suppressing the shift of the threshold voltage-of the MOS transistor caused by the boron leakage rather than the conventional polycrystalline silicon gate. (The hydrogen contained in the silicon nitride film for gate working mask and the gate side wall silicon nitride film for LDD causes the p+ polycrystalline silicon gate. MOS transistor to invert the type of the channel area substrate surface into the p type, thereby being unable to indicate the normal transistor characteristic.) On the other hand, it is understood that the present invention makes contribution to suppressing the fluctuation into 50 mV to 300 mV rather than the case where no boron is leaked. It is considered that this sort of fluctuation does not have an adverse effect on the circuit performance if a device and a circuit design are a little devised.

Second Embodiment

The dual gate CMOS semiconductor device was manufactured in the almost same process as the first embodiment. In this embodiment, however, the doping of impurity into the amorphous silicon was performed in the following procedure, which is the same as that of the first embodiment except the doping process.

After forming the gate insulating film 5, the amorphous silicon 6 was deposited. In the similar method to the first embodiment, the phosphorus ions were implanted on the portion where no mask material 7 is covered at 10 keV and in the range of $1\times10^{14}/cm^2$ and $1\times10^{15}/cm^2$ to $5\times10^{15}/cm^2$ or more. After removing this mask material, boron was implanted on the overall surface of the wafer at 3 keV and in the range of $2\times10^{18}/cm^3$ for doping the boron. As to the boron doping method, in addition to the ion implanting method, another method was studied such as an annealing in the state of flowing gas containing boron hydrocarbon and a solid source method for heating boron nitride for doping boron.

In this embodiment, phosphorus was doped only at the location where the gate of the n-channel MOS transistor is to be formed. Then, boron was doped. It is found that the doped phosphorus is effective in suppressing leakage of the boron doped later onto the substrate through the annealing.

Like the first embodiment, it is assured that the annealing in the hydrogen atmosphere containing vapor is performed for suppressing leakage of boron. In this embodiment, the annealing in the hydrogen atmosphere with no vapor serves to suppress leakage of boron resulting from the phosphorus. That is, the p-channel MOS transistor composed of amorphous silicon with no phosphorus causes the type of the channel area to be inverted into the p-type because of too much leaked boron, thereby being unable to operate properly. On the other hand, the n-channel MOS transistor composed of amorphous silicon with phosphorus doped therein has few leaked boron. The shift of its threshold voltage against the threshold voltage of the transistor with no boron leaked is so small as 0.1 to 0.7 V. It means that the n-channel MOS transistor indicates the normal MOS transistor characteristic. This embodiment, therefore, enables to expand the thermal budget against the leaked boron further than the first embodiment.

In a case that the concentration of phosphorus ion-implanted onto the amorphous silicon is $1\times10^{14}/cm^2$, the concentration of phosphorus segregated at the gate dielectric film interface is about $5\times10^{19}/cm^2$. Hence, the n-type impurity concentration on the interface with the gate insulating film is smaller than the p-type impurity, so that the depletion layer may be formed in the silicon layer of the gate electrode in some applied voltages. Hence, it does not indicate the characteristic estimated for the n-channel MOS transistor having a gate oxide film with a thickness of 3 nm. If the concentration of phosphorus is $1\times10^{15}/cm^2$ or more, the normal n-channel MOS transistor characteristic was obtained.

Third Embodiment

Figure 7:
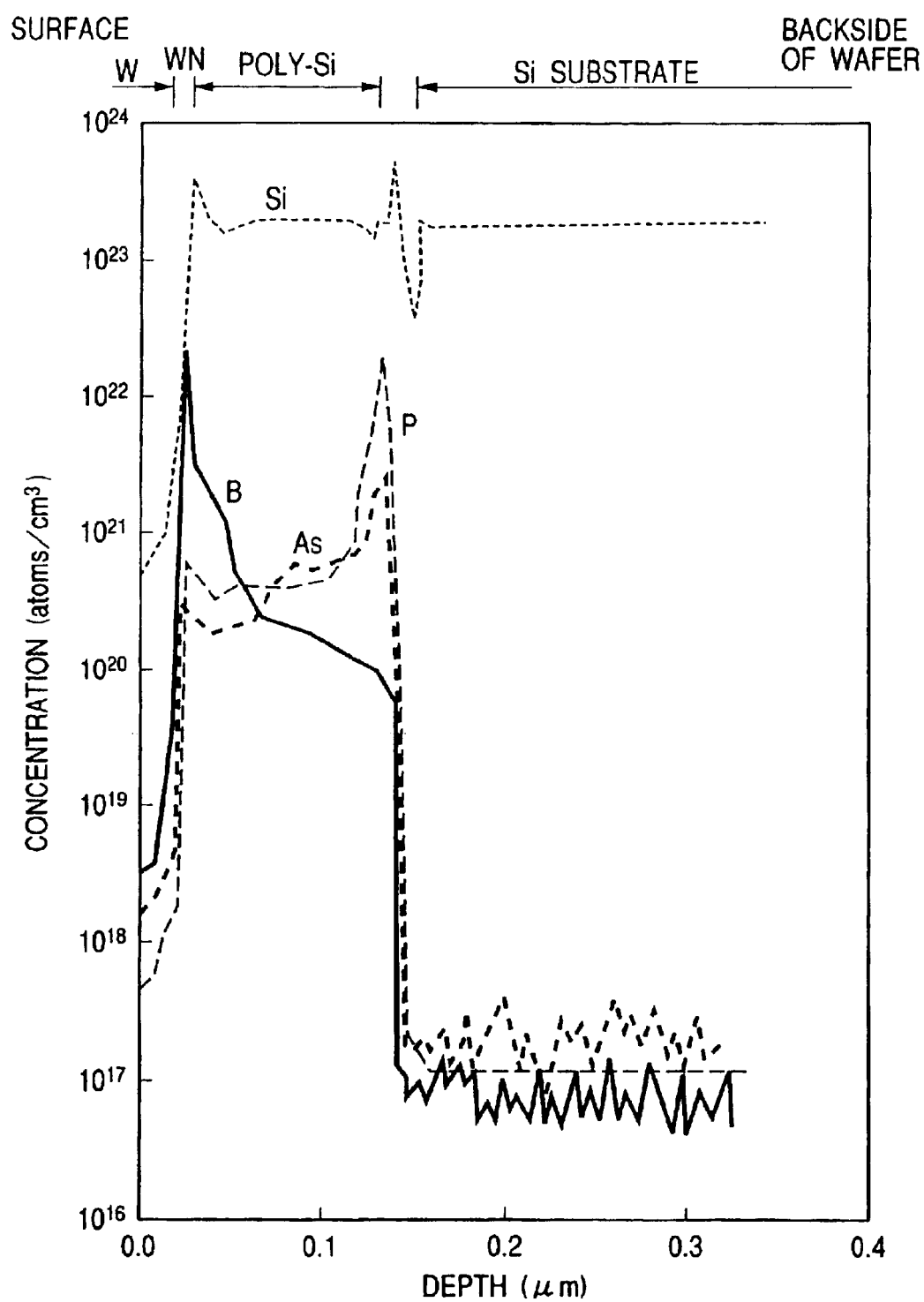
FIG. 7 is a graph showing a measured result by a secondary ion mass spectrograph with respect to a p-type impurity and an n-type impurity in the NMOS of the semiconductor device according to the third embodiment of the invention.

In this embodiment, in addition to the doping of phosphorus impurity in the foregoing embodiment, arsenic ions of $2\times10^{15}/cm^2$ were implanted at such an energy as a projection range into the middle of the amorphous or polycrystalline silicon layer. The distribution of the impurity in the depth direction of the silicon layer of the n-channel gate electrode of the stacked dual gate CMOS semiconductor device manufactured as above is illustrated in FIG. 7. It is obvious from FIG. 7 that the n-type impurity concentration at the n+/p+ junction formed within the polycrystalline silicon layer has a higher concentration than those of the first and the second embodiments. Hence, the resistance at the junction may be reduced further. In place of arsenic, antimony may be used for offering the same effect.

In the first and the second embodiments, as the n-type impurity to be doped, in place of phosphorus, arsenic or antimony may be used for achieving the object of the invention. In actual, however, the annealing of 700° C. or more is required for segregating these impurities on the interface of the gate insulating film.

Further, in the foregoing embodiments, the boron ions are used for doping boron by means of the ion implanting method. Alternatively, the compound ions such as boron fluoride may be used for doping boron.

According to the foregoing embodiments, in the dual gate CMOS semiconductor device having a gate electrode composed of p-type polycrystalline silicon and n-type polycrystalline silicon, just one mask is required for dividing the areas where the n-type and the p-type impurities are to be doped. As compared with the conventional semiconductor device formed by two masks, the semiconductor devices of these embodiments enable to reduce the number of the manufacturing steps, which leads to reduction of the manufacturing period, improvement of the yield, and reduction of the manufacturing cost of the semiconductor device. Moreover, the present invention is characterized by the stacked gate electrode structure and the segregation of boron on the metal nitride interface. This segregation effect serves to reduce the leaked boron.

What is claimed is:

1. A method of manufacturing a semiconductor device having an NMOS and a PMOS, comprising:

forming a gate insulating film on a semiconductor substrate;

forming a semiconductor film on said gate insulating film;

forming a mask for covering an area where said PMOS is formed, introducing phosphorus onto a corresponding portion of said semiconductor film to an area where said NMOS is formed, and performing an ion implantation of arsenic or antimony at such an energy as a projection range into the middle of said semiconductor film to said area where said NMOS is formed;

removing said mask and introducing boron onto the corresponding portion of said semiconductor film to the area where said NMOS is formed, and the corresponding portion of said semiconductor film to the area where said PMOS is formed;

forming a metallic nitride film on said semiconductor film on the areas where said NMOS and said PMOS are formed;

working a stacked film containing said semiconductor film and said metallic nitride film to form each gate electrode of said NMOS and said PMOS; and performing an annealing in a nitrogen atmosphere or in a hydrogen atmosphere with water vapor added thereto.

2. A method as claimed in claim 1, wherein, during annealing, boron is segregated on an interface of said metallic nitride film and said semiconductor film, and said phosphorus is segregated on an interface of said gate insulating film and said semiconductor film.

3. A method as claimed in claim 1, wherein said semiconductor film formed on said gate insulating film is formed as an amorphous silicon, and said amorphous silicon is changed into polycrystalline silicon after said annealing.

4. A method as claimed in claim 1, further comprising:
forming a metallic film on said metallic nitride film prior to working said stacked film, and said stacked film containing said semiconductor film, said metallic nitride film and said metallic film.

5. A method as claimed in claim 1, wherein said gate insulating film is a silicon oxynitride film.

6. A method of as claimed in claim 1, wherein said boron is introduced by ion implanting.

7. A method of manufacturing a semiconductor device having an NMOS and a PMOS, comprising:
a first step of forming a gate insulating film on an amorphous semiconductor substrate;
a second step of forming an amorphous semiconductor film on said gate insulating film;
a third step of forming a mask for covering an area where said PMOS is formed, and introducing phosphorus onto the corresponding portion of said amorphous semiconductor film to an area where said NMOS is formed, and performing an ion implantation of arsenic or antimony at such an energy as a projection range into the middle of said amorphous semiconductor film to said area where said NMOS is formed;
a fourth step of removing said mask and introducing boron onto the corresponding portion of said amorphous semiconductor film to the area where said NMOS is formed, and the corresponding portion of said amorphous semiconductor film to the area where said PMOS is formed;
a fifth step of forming a metallic nitride film on said semiconductor film on the areas where said NMOS and said PMOS are formed;
a sixth step of working a stacked film containing said semiconductor film and said metallic nitride film to form each gate electrode of said NMOS and said PMOS; and
a seventh step of performing an annealing in a nitrogen atmosphere or in a hydrogen atmosphere with water vapor added therto, and making said amorphous semiconductor film into polycrystalline silicon film.

8. A method as claimed in claim 7, wherein, at said seventh step, boron is segregated on an interface of said metallic nitride film and amorphous semiconductor film, and said phosphorus is segregated on an interface of said gate insulating film and amorphous semiconductor film.

9. A method as claimed in claim 7, further comprising an eighth step of forming a metallic film on said metallic nitride film between said fifth and sixth steps, and wherein at said sixth step, a gate electrode is composed of a stacked film containing said amorphous semiconductor film, said metallic nitride film and said metallic film.

10. A method as claimed in claim 7, wherein said gate insulating film is a silicon oxynitride film.

11. A method of manufacturing a semiconductor device having an NMOS and a PMOS, comprising:
a first step of forming a gate insulating film on a semiconductor substrate;
a second step of forming a semiconductor film on said gate insulating film;
a third step of forming a mask for covering an area where said PMOS is formed, and introducing phosphorus onto the corresponding portion of said semiconductor film to an area where said NMOS is formed, and performing an ion implantation of arsenic or antimony at such an energy as a projection range into the middle of said semiconductor film to said area where said NMOS is formed;
a fourth step of removing said mask and introducing boron onto the corresponding portion of said semiconductor film to the area where said NMOS is formed and the corresponding portion of said semiconductor film to the area where said PMOS is formed;
a fifth step of forming a metallic nitride film on said semiconductor film on the areas where said NMOS and said PMOS are formed;
a sixth step of forming a metallic film on said metallic nitride film on the areas where said NMOS and said PMOS are formed;
a seventh step of working a stacked film containing said semiconductor film, metallic nitride film and said metallic film for forming each gate electrode of said NMOS and said PMOS; and
an eighth step of performing an annealing in a nitrogen atmosphere or in a hydrogen atmosphere with water vapor added thereto.

12. A method as claimed in claim 11, wherein, at said eighth step, boron is segregated on an interface of said metallic nitride film and semiconductor film, and said phosphorus is segregated on an interface of said gate insulating film and semiconductor film.

13. A method as claimed in claim 11, wherein said semiconductor film formed on said gate insulating film is formed as an amorphous silicon at said second step, and said amorphous silicon is changed into polycrystalline silicon after said annealing at said eighth step.

14. A method as claimed in claim 11, wherein said gate insulating film is a silicon oxynitride film.

15. A method as claimed in claim 11, wherein, at said fourth step, said boron is introduced by ion implanting.

* * * * *